United States Patent
Farrell et al.

(10) Patent No.: US 6,643,331 B1
(45) Date of Patent: Nov. 4, 2003

(54) CODING METHOD AND APPARATUS

(75) Inventors: Wade Nicholas Farrell, Black Forest (AU); Mark Rice, Kensington Park (AU)

(73) Assignee: Inmarsat Ltd. (GB)

( * ) Notice: Subject to any disclaimer, the term of this patent is extended or adjusted under 35 U.S.C. 154(b) by 0 days.

(21) Appl. No.: 09/582,164

(22) PCT Filed: Dec. 24, 1997

(86) PCT No.: PCT/GB97/03551

§ 371 (c)(1),
(2), (4) Date: Aug. 21, 2000

(87) PCT Pub. No.: WO99/34521

PCT Pub. Date: Jul. 8, 1999

(51) Int. Cl.$^7$ ............................................. H04L 23/02
(52) U.S. Cl. ....................................... 375/261; 714/755
(58) Field of Search .................. 375/295, 259, 375/265, 262, 267; 714/755, 792, 757, 794, 795, 761, 762

(56) References Cited

U.S. PATENT DOCUMENTS

| | | | |
|---|---|---|---|
| 5,446,747 A | * 8/1995 | Berrou | 371/45 |
| 5,587,810 A | 12/1996 | Feldman | |
| 5,721,745 A | * 2/1998 | Hladik et al. | 371/43 |
| 5,734,962 A | * 3/1998 | Hladik et al. | 455/12.1 |
| 5,802,154 A | * 9/1998 | Dimolitsas et al. | 379/100 |
| 5,907,582 A | * 5/1999 | Yi | 375/259 |
| 5,996,104 A | * 11/1999 | Herzberg | 714/755 |
| 6,023,783 A | * 2/2000 | Divsalar et al. | 714/792 |
| 6,192,503 B1 | * 2/2001 | Chennakeshu et al. | 714/796 |

FOREIGN PATENT DOCUMENTS

| | | |
|---|---|---|
| GB | 2 286 739 A | 8/1995 |
| GB | 2 300 540 A | 11/1996 |
| WO | WO 97/00561 | 1/1997 |

OTHER PUBLICATIONS

Berrou, Claude et al., Near Shannon Limit Error—Correcting Coding and Decoding: Turbo–Codes (1), IEEE 1993, pp. 1064–1070.

Pietrobon, Steven S., Implementation and Performance of a Serial MAP Decoder for use in an Iterative Turbo Decoder, Whistler Conference Centre, Whister, British Columbia, Canada, Sep. 17–22, 1995, Sponsored by The Information Theory Society of The Institute of Electrical and Electronics Engineers, 3 pages.

Barbulescu, Sorin Adrian, Iterative Decoding of Turbo Codes and Other Concatenated Codes, A Dissertation submitted to the School of Electronic Engineering Faculty of Engineering, University of South Australia for the Degree of Doctor of Philosophy, Feb. 1996, 8 pages.

* cited by examiner

Primary Examiner—Emmanuel Bayard
(74) Attorney, Agent, or Firm—Sterne, Kessler, Goldstein & Fox P.L.L.C.

(57) ABSTRACT

A parallel concatenated coder (20) outputs a sequence of data sets in which earlier data sets contain data bits (d) and non-interleaved parity bits (p) without interleaved parity bits (q), while later data sets include the interleaved parity bits (q). Each data set is modulated as one symbol. The output format partially overcomes the delay incurred by interleaving the parity bits (q), with a substantially even distribution of data and parity bits in the sequence of data sets. The delay may be reduced further by interleaving with an index constraint.

23 Claims, 5 Drawing Sheets

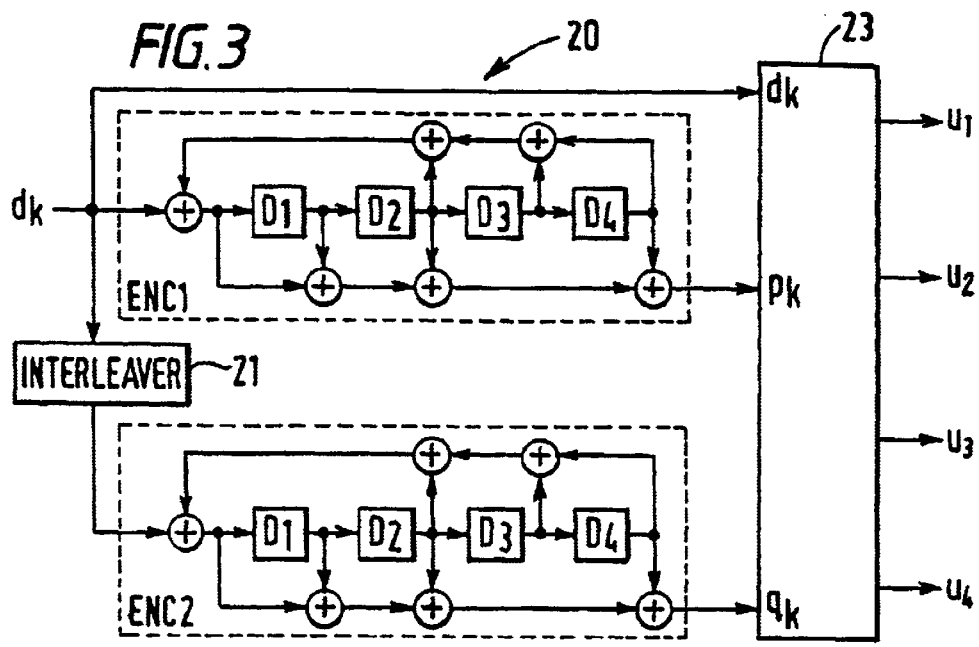
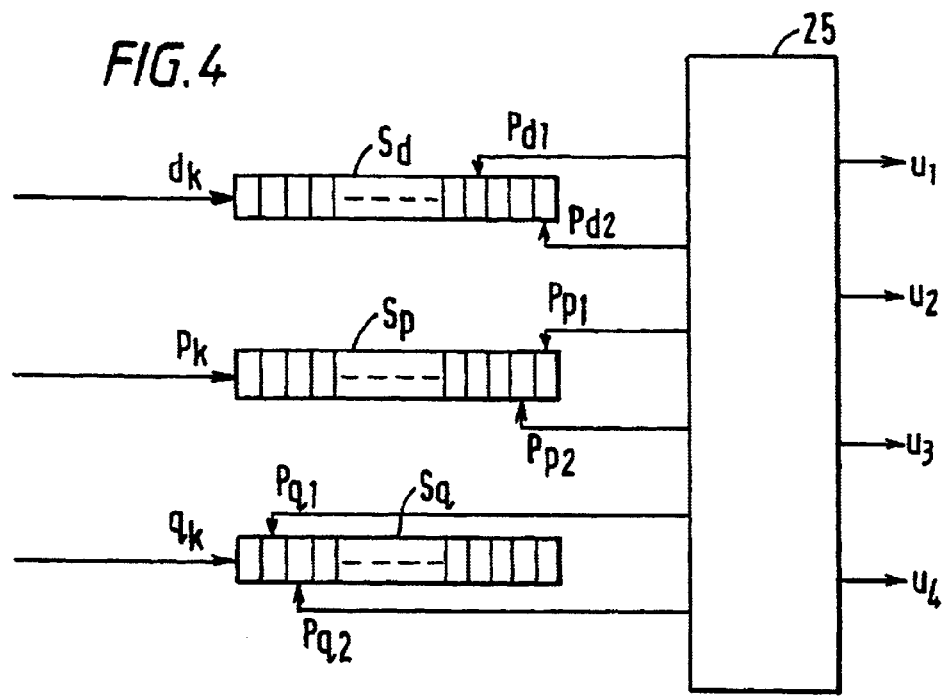

CODING METHOD AND APPARATUS

TECHNICAL FIELD

The present invention relates to a coding method and apparatus involving parallel concatenated codes linked by an interleaver, for use in wireless digital transmission.

BACKGROUND ART

Parallel concatenated convolutional codes, known as 'Turbo' codes, have been disclosed in the paper 'Near Shannon Limit Error-Correcting Coding and Decoding: Turbo-Codes(1)', Berrou, Glavieux and Thitimajshima, ICC'93 Geneva, May 23–26, 1993, as well as in U.S. Pat. No. 5,446,747. This type of code has attracted much attention in the digital transmission field because of its bit error rate performance close to the Shannon limit. The Turbo encoder as originally proposed consists of two recursive systematic convolutional coders. The two encoders receive the same information bits, but the input of one of the encoders is connected to an interleaver so that the order of the input bits is scrambled.

Parallel concatenated encoders using constituent codes other than convolutional codes have also been proposed, for example in the article 'Unveiling Turbo Codes: Some Results on Parallel Concatenated Coding Schemes' by Benedetto and Montorsi, IEEE Transactions on Information Theory, Vol. 42, No. 2, March 1996, and in 'Iterative Decoding of Turbo Codes and Other Concatenated Codes', a dissertation dated February 1996, by S. A. Barbulescu of the Institute of Telecommunications Research, University of South Australia.

However, the use of the interleaver in Turbo and related codes results in a long encoding delay, which has prevented their adoption in real time applications such as digital mobile telephony (see the article by Benedetto and Montorsi cited above).

STATEMENT OF THE INVENTION

According to the present invention, there is provided a parallel concatenated encoder which generates a sequence of data sets for transmission. Interleaved parity bits are not included in earlier data sets, which contain data bits and non-interleaved parity bits. As a result, the delay incurred by interleaving the interleaved parity bits is not fully incurred in the output of the sequence of data sets as a whole; at the same time, uneven distribution of data bits and parity bits is avoided in a substantial part of the sequence.

In some embodiments of the invention, the interleaved parity bits have an index constraint substantially less than the size of the interleaver. This allows interleaved parity bits to be output before all of the data bits have been stored in the interleaver, further reducing the delay incurred by the encoder, without significantly increasing the bit error rate over a transmission channel.

BRIEF DESCRIPTION OF THE DRAWINGS

Specific embodiments of the present invention will now be described with reference to the accompanying drawings, in which:

FIG. 3 is a schematic diagram of a turbo encoder in the earth station of FIG. 2;

FIG. 4 shows the features of the buffer of FIG. 3;

MODES FOR CARRYING OUT THE INVENTION

Figure 1:
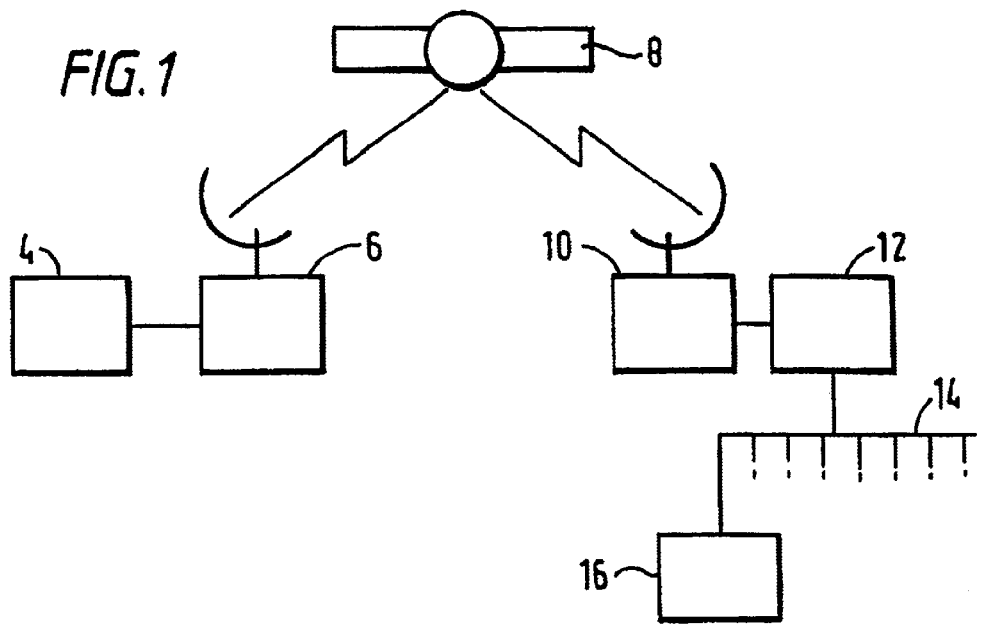
FIG. 1 is a schematic diagram of a satellite communications system.

As shown in FIG. 1, mobile terminal equipment 4 is connected to a mobile earth station (MES) 6. The mobile terminal equipment 4 may comprise telephone equipment, facsimile equipment or data terminal equipment, and may include interface equipment for allowing telephone, facsimile or data terminals designed for connection to other types of network to be connected to the satellite network. Examples of such interface equipment are described in GB 2286739, U.S. Pat. No. 5,587,810, GB 2300540, and WO 97/00561. The mobile terminal equipment 4 sends digital data to the MES 6 for RF modulation and transmission to a satellite 8, and the MES 6 receives and demodulates digital data from the satellite 8, the demodulated data then being sent to the mobile terminal equipment 4.

The satellite 8 carries a transponder which receives modulated signals, converts them to an intermediate frequency, amplifies them and retransmits them at a different frequency from the received frequency. The satellite 8 thereby links the MES 6 to a land earth station (LES) 10, so that signals transmitted by the MES 6 are received by the LES 10 and vice versa, via the satellite 8.

The LES 10 is connected to a network interface 12 for providing an interface to a network 14, in this case a PSTN. A call is thereby connected over the network 14 to fixed terminal equipment 16, which comprises telephone, facsimile or data terminal equipment compatible with the mobile terminal equipment 4.

Figure 2:
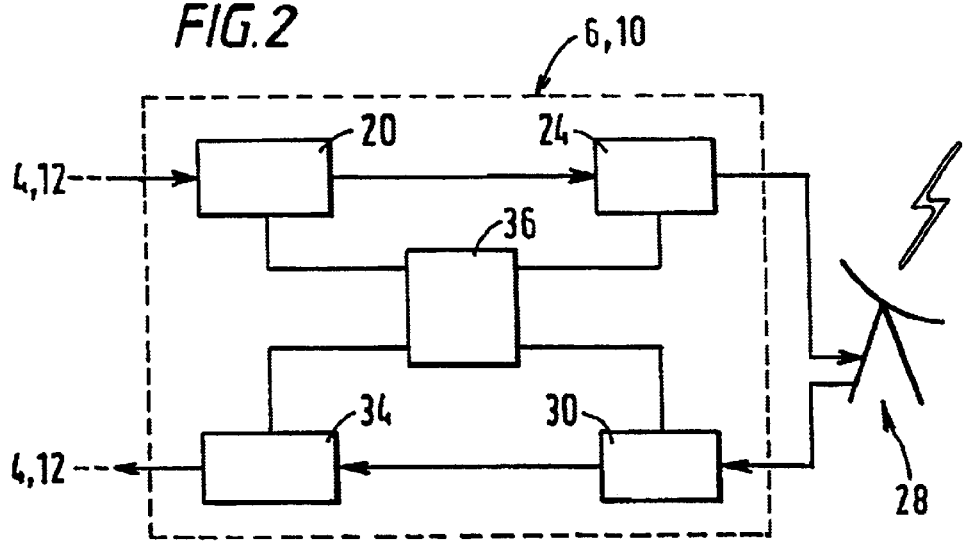
FIG. 2 is a schematic diagram of an earth station in the system of FIG. 1.

FIG. 2 shows the relevant functional sections of both the MES 6 and the LES 10 in more detail. The functions of the MES 6 and the LES 10 are distinct in other respects, but for convenience the same diagram and reference numerals are used for the relevant sections of both.

Digital data received from the mobile terminal equipment 4 or network interface 12 is encoded by an encoder 20 and then modulated by a modulator 24. The modulated output is transmitted by an antenna assembly 28. Signals received from the antenna assembly 28 are demodulated by a demodulator 30 to generate digital data which is decoded by a decoder 34. The output of the decoder 34 is connected to the mobile terminal equipment 4 or network interface 12. The operation of the functional sections is controlled by a controller 36.

The encoder 20 is a Turbo encoder of the type shown in FIG. 3. Data bits $d_k$ are input to a first encoder ENC1, and to an interleaver 21, the output of which is connected to a second encoder ENC2. Each encoder ENC1 and ENC2 is a recursive convolutional coder comprising four intermediate binary stores D1 to D4, and binary adders or exclusive-OR gates. With each cycle, the contents of each of the binary stores D1 to D3 is shifted to binary stores D2 to D4 respectively, while the new contents of D1 are derived from the previous contents of D2 to D4. The output $p_k$ from the first encoder and the output $q_k$ from the second encoder are derived from the contents of the binary stores D1, D2 and D4 and from the input to the binary store D1.

The data bits $d_k$, the non-interleaved parity bits $p_k$ and the interleaved parity bits $q_k$ are output to a buffer 23 from which sets of bits ($u_1$, $u_2$, $u_3$, $u_4$) are output in parallel in accordance with a puncturing format, examples of which are described below.

As shown in FIG. 4, the buffer 23 comprises memory stores $S_d$, $S_p$ and $S_q$ for the data bits d, non-interleaved parity bits p and interleaved parity bits q respectively. Data and parity bits are read out of the memory stores S from addresses indicated by first and second pointers $P_{d1}$, $P_{d2}$, $P_{p1}$, $P_{p2}$, $P_{q1}$, $P_{q2}$ for each of the memory stores $S_d$, $S_p$ and $S_q$ respectively and output as a selected one of the output bits $u_1$, $u_2$, $u_3$, $u_4$ determined by a multiplexer 25. The sequence of addresses from which the data and parity bits are read out and the sequence of settings of the multiplexer together determine the transmission format of the data and parity bits and the puncturing scheme of the parity bits, not all of which are transmitted. The arrangement shown in FIGS. 3 and 4 is a functional representation of the turbo encoder and may be implemented entirely in a suitably programmed digital signal processor (DSP).

In a conventional format, the outputs of the encoder 20 are rate half punctured and modulated as follows. At each clock cycle, the systematic data bit $d_k$ is selected as output together with an alternating one of the parity bits $p_k$, $q_k$. The parity bit which is not selected is discarded. The output data bits and parity bits for each pair of clock cycles are modulated as one symbol in a 16 QAM (16 quadrature amplitude modulation) scheme.

The conventional format is represented in Table 1 below.

TABLE 1

| Cycle | 1 | 2 | 3 | 4 |
|---|---|---|---|---|
| data $d_k$ | $d_1$ | $d_2$ | $d_3$ | $d_4$ |
| parity $p_k$ | $p_1$ | — | $p_3$ | — |
| parity $q_k$ | — | $q_2$ | — | $q_4$ |
| 16QAM Symbol | ($d_1$, $p_1$, $d_2$, $q_2$) | | ($d_3$, $p_3$, $d_4$, $q_4$) | |

Each symbol is formed from the four bits ($u_1$, $u_2$, $u_3$, $u_4$) with the bits $u_1$, $u_2$ modulating the I (amplitude) component and the bits $u_3$, $u_4$ modulating the Q (phase) component such that:

$A_j = [u_1, u_2] \rightarrow I$ $B_j = [u_3, u_4] \rightarrow Q$

Figure 5:
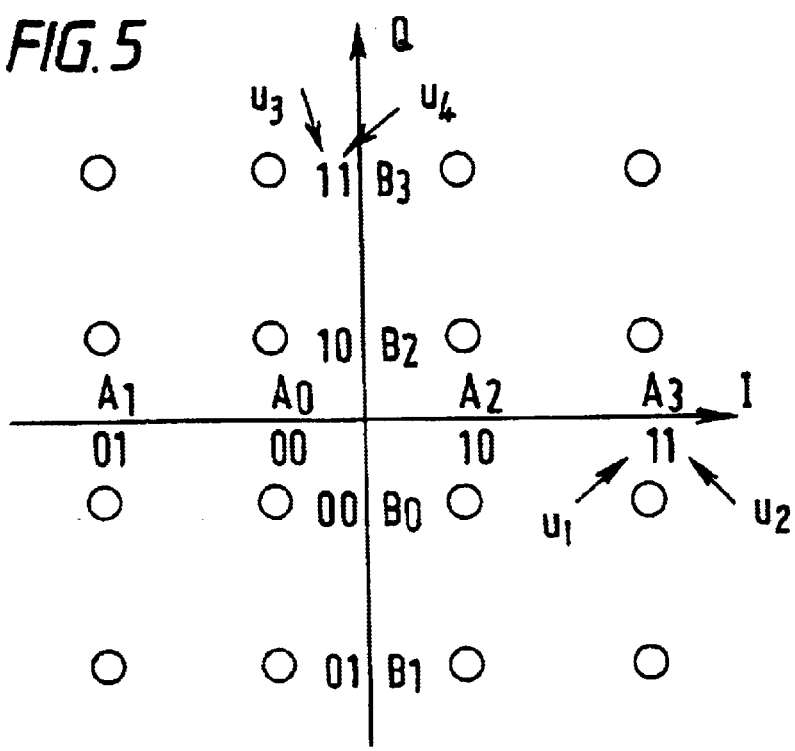
FIG. 5 is a diagram of the modulation scheme implemented by the modulator of the earth stations.

The modulation scheme, as shown in FIG. 5, is square 16 QAM, although a circular 16 QAM scheme may be used. The data bits $u_1$, $u_3$ are the most protected in the 16 QAM symbol.

Figure 6:
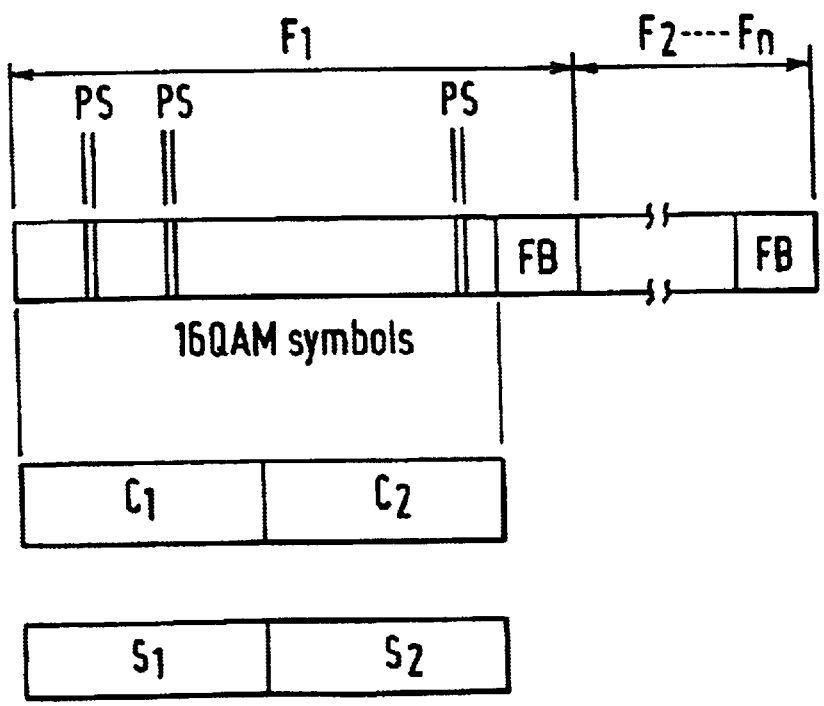
FIG. 6 is a diagram of the transmission frame format used by the earth stations.

The symbols are transmitted in a frame format as shown in FIG. 6. Data is transmitted in a single channel per carrier (SCPC) channel format. The start of a data sequence is indicated by a preamble P and a unique word UW to aid acquisition of the channel. The data is then transmitted in frames $F_1$ to $F_n$ each consisting of 16 QAM symbols interspersed with PSAM (pilot symbol assisted modulation) blocks PS, to allow measurement of fading and noise variance, so as to assist in decoding. At the end of each frame is a framing bit pattern FB. Encoded in the symbols of each frame are two turbo-coded sub-frames $C_1$ and $C_2$ corresponding to two unencoded sub-frames $S_1$ and $S_2$. The end of the data sequence is indicated by an end of data signal EOD.

Figure 7:
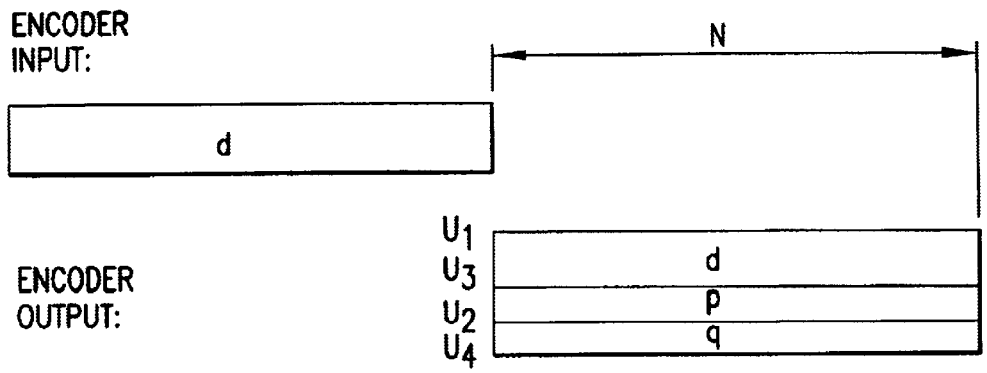
FIG. 7 is a diagram of the delay incurred in transmission of a frame over the satellite link in a conventional or known output format.

The size of the interleaver 21 of the encoder 20 is equal to that of the subframes $S_1$ and $S_2$. In one example, the interleaver 21 is a random interleaver in which an entire block is loaded into the interleaver 21 and the contents are then output in a pseudo-random order. In this case, the entire contents of one of the subframes $S_1$ or $S_2$ are loaded into the interleaver 21 before the parity bits $q_k$ are output. Hence, the delay incurred by the encoder 20 is at least N, where N is the time taken to receive the number of bits in one of the subframes $S_1$ or $S_2$. The delay is shown graphically in FIG. 7, with time on the horizontal axis. In the encoder output, the different bits ($u_1$, $u_2$, $u_3$, $u_4$) are indicated on the vertical axis.

In accordance with embodiments of the present invention, the delay incurred by the encoder 20 is reduced to a fraction of the delay N in the scheme described above, by rearranging the order of transmission of the data bits d and the parity bits p and q. Each embodiment is shown using a rate half turbo code, although other rates may be used.

Figure 8:
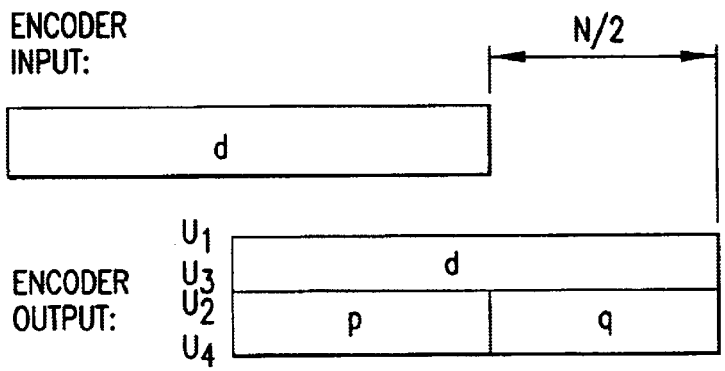
FIG. 8 is a diagram of the order of transmission of bits from the encoder in a first embodiment of the present invention.

In a first embodiment, as shown in FIG. 8, the parity bits p are output in the first half of a subframe C and the interleaved parity bits q are output in the second half of the subframe C. Note that the interleaved parity bits q are only output once all of the data bits d have been received, but the delay involved is reduced to N/2 because two interleaved parity bits q are transmitted per symbol, since all the parity bits p have already been transmitted.

Figure 9:
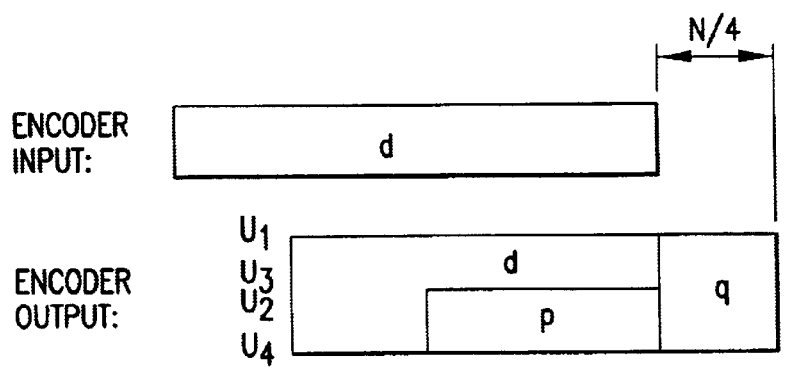
FIG. 9 is a diagram of the order of transmission of bits from the encoder in a second embodiment of the present invention.

In a second embodiment shown in FIG. 9, all of the data bits d and the parity bits p are transmitted before the interleaved parity bits q. During the first quarter of the subframe C, only the data bits d are transmitted; during the middle half of the subframe C, data bits and parity bits p are transmitted; during the final quarter of the subframe C, only the interleaved parity bits q are transmitted. Hence, the delay is reduced to N/4 because four interleaved parity bits q are transmitted per symbol. However, half of the data bits d in the first quarter of the subframe C are transmitted as the less protected bits (U2, U4) of the 16 QAM symbols, leading to an increase in bit error rate relative to the first embodiment. Moreover, since the distribution of data bits d and parity bits p, q is uneven throughout the subframe C, the format is particularly susceptible in fading channels with a fade rate comparable to the subframe rate. In such a case, the data bits in the first quarter of the subframe C may repeatedly coincide with the fading, giving a high bit error rate.

In the third and fourth embodiments described below, the interleaver 21 is subject to an index constraint such that:

$$\max_i |i - \pi(i)| \le \frac{N}{2} \qquad i = 0 \ldots N-1$$

where i is the order of a data bit input to the interleaver 21 and $\pi(i)$ is the corresponding output order. As a result, it is possible to begin output of the interleaved parity bits after only N/2 data bits have been input into the interleaver 21. The index constraint has a small effect on the bit error rate performance, but gives greater flexibility in the format of the subframe C, as shown below.

Figure 10:
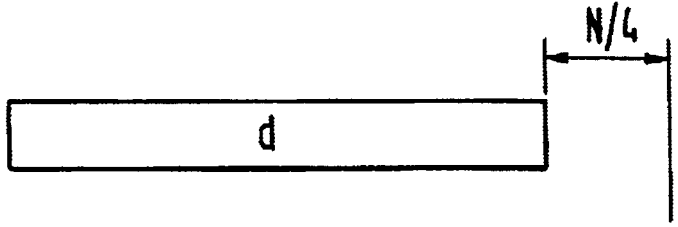
FIG. 10 is a diagram of the order of transmission of bits from the encoder in a third embodiment of the present invention.

In a third embodiment of the present invention, as shown in FIG. 10, the data bits d are evenly distributed throughout the subframe C and always occupy the two most protected bit positions of the 16 QAM symbol. In the first quarter of the subframe C, the first half of the non-interleaved data bits p occupy 2 bits per symbol; in the middle half, the second half of the non-interleaved parity bits p and the first half of the interleaved parity bits q each occupy one bit per symbol; in the final quarter, the second half of the interleaved parity bits q occupy two bits per symbol. The resultant delay is N/4 bits, as in the second embodiment, but the problems of less protected data bits d and uneven distribution of data bits and parity bits are avoided.

Figure 11:
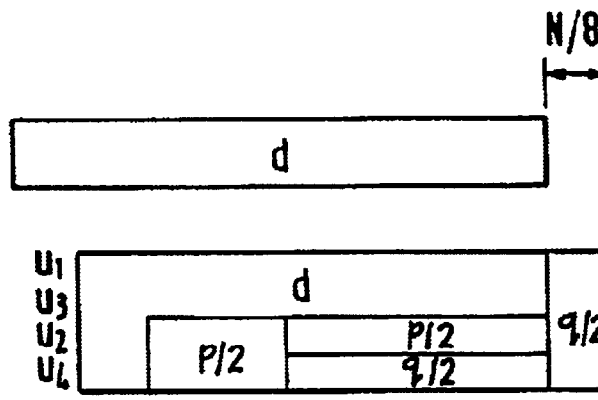
FIG. 11 is a diagram of the order of transmission of bits from the encoder in a fourth embodiment of the present invention.

In a fourth embodiment of the present invention, as shown in FIG. 11, the effective delay is reduced to N/8, at the expense of the disadvantages of the second embodiment. In the first eighth of the subframe C, all four bit positions of the symbol are occupied by data bits d. In the next quarter, the two most protected bit positions are occupied by data bits d, while the two less protected bit positions are occupied by the non-interleaved parity bits p. In the next half, the two more protected bit positions are also occupied by data bits d, while one each of the less protected bit positions are occupied by the non-interleaved parity bits p and the interleaved parity bits q. In the final eighth of the subframe C, all of the bit positions are occupied by the interleaved parity bits q.

In the decoder 34, the bits are demodulated and a probability is estimated for each bit. The demodulated bits are separated into data bits d, non-interleaved parity bits p and interleaved parity bits q according to the format used for transmission. The bits are then decoded using a MAP decoder, of the type known from example from 'Implementation and performance of a serial MAP decoder for use in an iterative turbo decoder', S. S. Pietrobon, IEEE Int. Symp. Inform. Theory, Whistler, British Columbia, Canada, September 1995.

Modifications of the above embodiments may be envisaged within the scope of the present invention. For example, alternative modulation schemes may be used, such as 8 PSK (8 phase shift keying). Alternative rate codes may be produced, by using different puncturing rates. Although recursive convolutional codes are preferred as the constituent codes of the encoder 20, other constituent codes such as block codes may be used. The data bits d may be pre-coded before being input to the encoder 20, and/or further encoded after being output from the buffer 21.

The above embodiments are provided purely by way of example, and further modifications may be envisaged without departing from the scope of the appended claims.

What is claimed is:

1. A coding and modulation method for digital data, comprising:
   receiving an input sequence of data bits;
   encoding sad input sequence to generate a first encoded sequence of data bits;
   interleaving said input sequence to create an interleaved sequence of data bits;
   encoding said interleaved sequence of data bits to generate a second encoded sequence of data bits; and
   modulating a sequence of data sets each including at least one of a data bit derived from said input sequence, a first parity bit derived from said first encoded sequence and a second parity bit derived from said second encoded sequence,
   wherein during an earlier period each of a plurality of said data sets includes at least one said data bit and one said first parity bit but does not include any said second parity bits,
   and during a later period each of a plurality of said data sets includes at least one said second parity bit.

2. A method as claimed in claim 1, wherein during said later period each said data set includes one or more said data bits and one or more said second parity bits.

3. A method as claimed in claim 2, wherein during said later period each said data set includes one or more said first parity bits.

4. A method as claimed in claim 1 wherein in a first period preceding said earlier period each said data set includes one or more said data bits and does not include any said first or second parity bits.

5. A method as claimed in claim 1 wherein in a last period subsequent to said later period each said data set includes one or more said second parity bits and does not include any said first parity bits.

6. A method as claimed in claim 5, wherein in said last period each said data set does not include any said data bits.

7. A method as claimed in claim 1, wherein the step of modulating comprises outputting a sequence of modulation states, each corresponding to a state of one of said data sets.

8. A method as claimed in claim 7, wherein said data sets correspond to said modulation states such that, when said data set includes both at least one said data bit and said at least one first or second parity bit, said at least one data bit is more protected than said at least one first or second parity bit.

9. A method as claimed in claim 1, wherein said interleaving step is performed such that the order of any bit of said interleaved sequence differs from the order of the corresponding bit of said input sequence by less than a predetermined number, said predetermined number being substantially less than the number of bits in an interleaver in which the input sequence is stored for interleaving.

10. A method as claimed in claim 1 wherein said first encoded sequence and said second encoded sequence are each encoded by means of a recursive convolutional coding algorithm.

11. Apparatus for modulating digital data, comprising:
    a first encoder for encoding an input sequence of data bits to generate a first encoded sequence of data bits;
    an interleaver for interleaving said input sequence of data bits to generate an interleaved sequence of data bits;
    a second encoder for encoding said interleaved sequence of data bits to generate a second encoded sequence of data bits; and
    a modulator for modulating a sequence of data sets each including at least one of a data bit derived from said input sequence, a first parity bit derived from said first encoded sequence and a second parity bit derived from said second encoded sequence,
    such that during an earlier period each of a plurality of said data sets includes at least one said data bit and one said first parity bit but does not include any said second parity bits,
    and during a later period each of a plurality of said data sets includes at least one said second parity bit.

12. Apparatus as claimed in claim 11, wherein the modulator is operable such that during said later period each said data set includes one or more said data bits and one or more said second parity bits.

13. Apparatus as claimed in claim 12, wherein the modulator is operable such that during said later period each said data set includes one or more said first parity bits.

14. Apparatus as claimed in claim 11, wherein the modulator is operable such that in a first period preceding said earlier period each said data set includes one or more said data bits and does not include any said first or second parity bits.

15. Apparatus as claimed in claim 11, wherein the modulator is operable such that in a last period subsequent to said later period each said data set includes one or more said second parity bits and does not include any said first parity bits.

16. Apparatus as claimed in claim 15, wherein the modulator is operable such that in said last period each said data set does not include any said data bits.

17. Apparatus as claimed in claim 11, wherein the modulator is operable to output a sequence of modulation states, each corresponding to a state of one of said data sets.

18. Apparatus as claimed in claim 17, wherein said data sets correspond to said modulation states such that, when said data set includes both said at least one data bit and said at least one first or second parity bit, said at least one data bit is more protected than said at least one first or second parity bit.

19. Apparatus as claimed in claim 11, wherein said interleaver is arranged such that the order of any bit of said interleaved sequence differs from the order of the corresponding bit of said input sequence by less than a predetermined number, said predetermined number being substantially less than the number of bits in an interleaver in which the input sequence is stored.

20. Apparatus as claimed in claim 11, wherein said first and second encoders are each arranged to perform a recursive convolutional coding algorithm.

21. A satellite earth station including apparatus as claimed in claim 11.

22. A method of modulating a systematic code word including data bits and interleaved parity bits derived from said data bits via an intermediate interleaving step, wherein the modulation of the first of said parity bits is delayed by a plurality of modulation symbol periods relative to that of the first of said data bits, and the period over which the data bits are modulated overlaps the period over which the parity bits are modulated.

23. Apparatus for modulating a systematic code word including data bits and interleaved parity bits derived from said data bits via an intermediate interleaving step, characterised by means for delaying the modulation of the first of said parity bits by a plurality of modulation symbol periods relative to that of the first of said data bits, such that the period over which the data bits are modulated overlaps the period over which the parity bits are modulated.

* * * * *